United States Patent
Resta et al.

(10) Patent No.: US 7,787,291 B2
(45) Date of Patent: Aug. 31, 2010

(54) PROGRAMMING A MULTILEVEL PHASE CHANGE MEMORY CELL

(75) Inventors: Claudio Resta, Pavia (IT); Marco Ferraro, Agrate Brianza (IT); Ferdinando Bedeschi, Biassono (IT); Alessandro Cabrini, Agrate Brianza (IT)

(73) Assignee: Intel Corporation, Santa Clara, CA (US)

( * ) Notice: Subject to any disclaimer, the term of this patent is extended or adjusted under 35 U.S.C. 154(b) by 2 days.

(21) Appl. No.: 11/904,306

(22) Filed: Sep. 26, 2007

(65) Prior Publication Data

US 2009/0080242 A1 Mar. 26, 2009

(51) Int. Cl.
*G11C 11/00* (2006.01)
(52) U.S. Cl. .................................. 365/163; 365/148
(58) Field of Classification Search .................. 365/163, 365/148, 230.06, 185.18–185.19, 63, 51; 257/2–5

See application file for complete search history.

(56) References Cited

U.S. PATENT DOCUMENTS

| | | | | |
|---|---|---|---|---|
| 4,225,946 A | * | 9/1980 | Neale et al. | 365/163 |
| 6,487,113 B1 | * | 11/2002 | Park et al. | 365/163 |
| 6,625,054 B2 | * | 9/2003 | Lowrey et al. | 365/148 |
| 7,372,725 B2 | * | 5/2008 | Philipp et al. | 365/148 |
| 7,426,134 B2 | * | 9/2008 | Happ et al. | 365/158 |
| 7,486,536 B2 | * | 2/2009 | Kim et al. | 365/163 |

* cited by examiner

*Primary Examiner*—David Lam
(74) *Attorney, Agent, or Firm*—Trop, Pruner & Hu, P.C.

(57) ABSTRACT

Multilevel phase change memory cells may be programmed forming amorphous regions of amorphous phase change material in a storage region of the phase change memory cell. Crystalline paths of crystalline phase change material are formed through the amorphous regions of amorphous phase change material. Lengths of the crystalline paths are controlled so that at least a first crystalline path has a first length in a first programming state and a second crystalline path has a second length, different from the first length, in a second programming state.

19 Claims, 9 Drawing Sheets

| D R | 00 | 01 | 10 | 11 |
|---|---|---|---|---|
| 00 | STOP | R2 SCU | SET R1 SCU | SET |
| 01 | (SET) R1 | STOP | SET R1 SCU | SET |
| 10 | R1 | R2 SCU | STOP | SET |
| 11 | R1 | R2 SCU | R1 SCU | STOP |

US 7,787,291 B2

PROGRAMMING A MULTILEVEL PHASE CHANGE MEMORY CELL

BACKGROUND

The present invention relates to a multilevel phase change memory.

As is known, phase change memories use a class of materials that have the property of switching between two phases having distinct electrical characteristics, associated with two different crystallographic structures of the material: an amorphous, disorderly phase, and a crystalline or polycrystalline, orderly phase. The two phases are hence associated to resistivities of considerably different values.

Currently, the alloys of elements of group VI of the periodic table, such as Te or Se, referred to as chalcogenides or chalcogenic materials, can be used advantageously in phase change memory cells. The currently most promising chalcogenide is formed from an alloy of Ge, Sb and Te (Ge2Sb2Te5), also called GST, which is now widely used for storing information on overwritable disks and has been also proposed for mass storage.

In chalcogenides, the resistivity varies by two or more orders of magnitude when the material passes from the amorphous (more resistive) phase to the crystalline (more conductive) phase, and vice versa.

BRIEF DESCRIPTION OF THE DRAWINGS

For the understanding of the present invention, some embodiments thereof will be now described, purely as non-limitative examples, with reference to the enclosed drawings, wherein.

DETAILED DESCRIPTION

Figure 1:
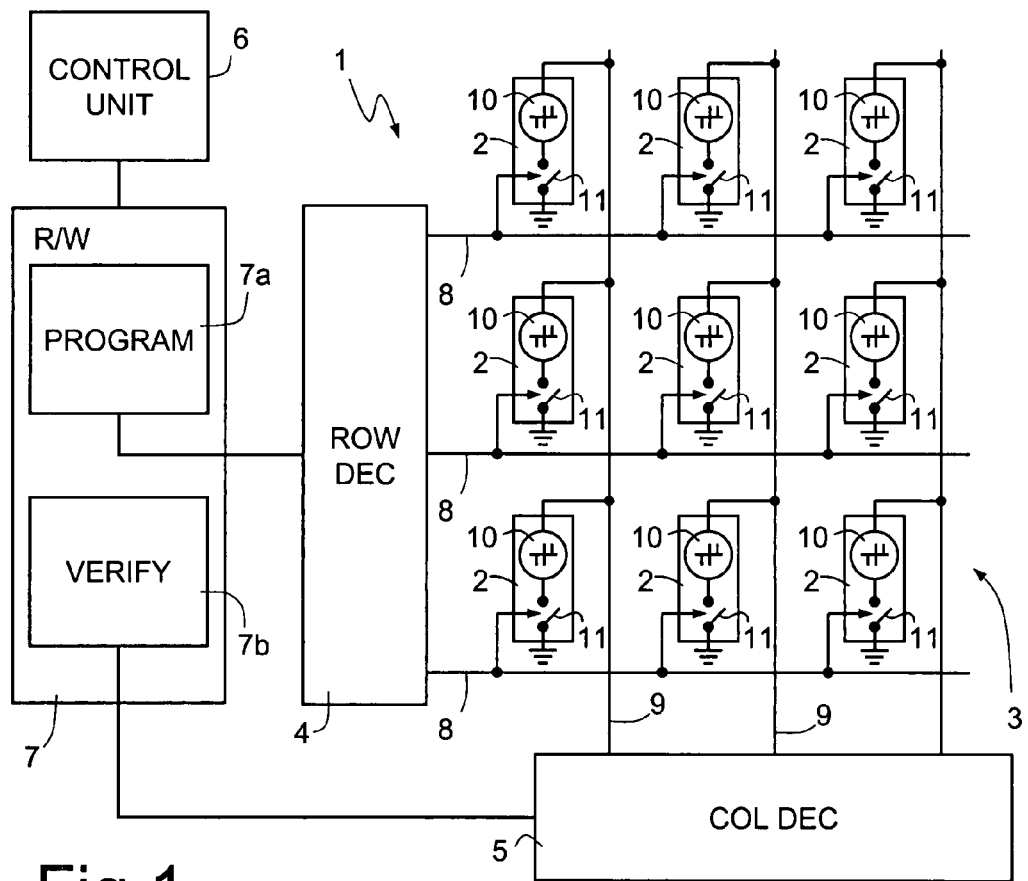
FIG. 1 is a simplified block diagram of a phase change memory device according to one embodiment of the present invention.

FIG. 1 shows a phase change memory ("PCM" hereinafter) device 1. A plurality of PCM cells 2 are arranged in rows and columns to form an array 3. A row decoder 4 and a column decoder 5 are coupled to a control unit 6 and to a read/program unit 7, which includes a program circuit 7a and a read/verify circuit 7b. Word lines 8 and bit lines 9 run parallel to rows and columns, respectively, and are selectively connectable to the read/program unit 7 through the row decoder 4 and the column decoder 5, in a known manner. Other arrangements may also be used.

Each PCM cell 2 is connected at a cross-point of a respective word line 8 and a respective bit line 9 and includes a storage element 10, of the phase change type, and a selection element 11. The storage element 10 has a first terminal connected to the respective bit line 9 and a second terminal connected to a first terminal of the selection element 11. The selection element 11 has a second terminal grounded and a control terminal connected to the respective word line 8. According to alternative solutions, the storage element 10 and the selection element 11 of each PCM cell 2 may be exchanged in position; moreover, the selection elements 11 may have two terminals only (e.g. diodes). Other arrangements may also be used.

The program circuit 7a is configured to provide programming pulses (not indicated in FIG. 1) to selected PCM cells 2, according to a programming method described below. The read/verify circuit 7b is connected to the selected PCM cells 2 for reading the information stored therein (e.g., after each programming pulse). In one embodiment, the read/verify circuit 7b is configured to carry out current reading of the PCM cells 2. In practice, output currents of PCM cells 2 are compared to appropriate read current reference levels (conventional reading) or program current reference levels (verify operation).

Figure 2:
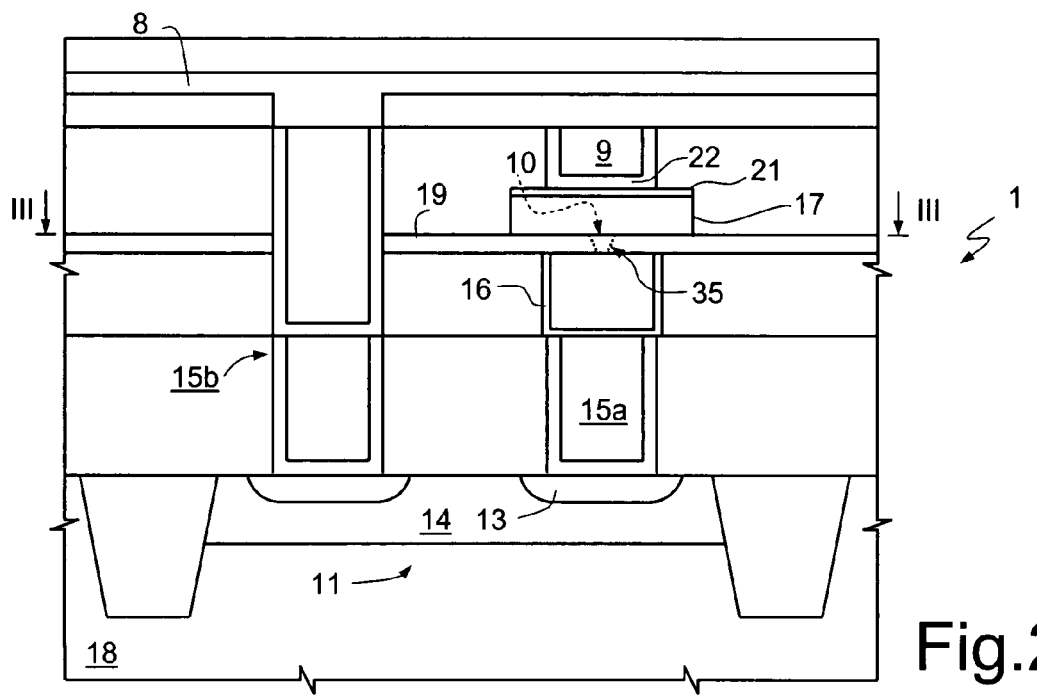
FIG. 2 is a cross-section through a portion of the phase change memory device of FIG. 1.

A cross-section of one embodiment of a PCM cell 2 is illustrated in FIG. 2. In the embodiment, the selection element 11 is a PNP bipolar transistor having an emitter region 13, a base region 14 and emitter and base contacts 15a, 15b. However, in other embodiments different selection elements may be used (e.g., NPN bipolar transistors, MOS transistors or diodes). An intrinsic collector of the selection element 11 is formed in a semiconductor substrate 18, wherein the whole array 3 is integrated.

Figure 3:
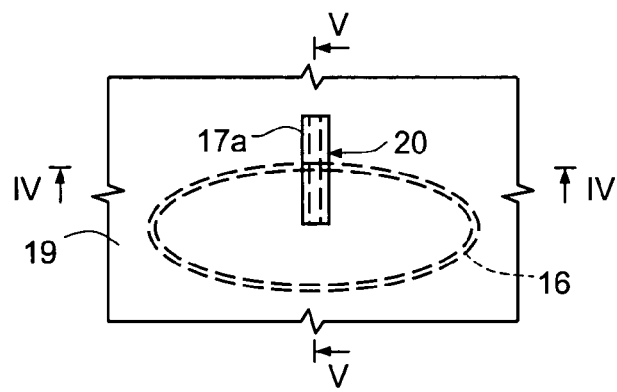
FIG. 3 is a top plan view, with part removed for simplicity, of a particular of the device of FIG. 1.

A cup-shaped heating element 16 may be formed on the emitter contact 15a. An upper portion of the heating element is defined by a circular or oval wall having sublithographic thickness, as also shown in FIG. 3. Here, the term "sublithographic" means a linear dimension smaller than the minimum dimension achievable with current optical (UV) lithographic techniques, and hence smaller than 100 nm, preferably 50-60 nm, down to approximately 5-20 nm.

A strip 17 of a crystalline chalcogenic material, e.g. GST, may run parallel to the bit lines 9 which run into the page in FIG. 2. The strip 17 may be separated from the heating element 16 by a microtrench layer 19 (e.g., nitride). The strip 17 may be made by a high-temperature deposition process, in order to make sure that it is in the crystalline state.

Figure 4:
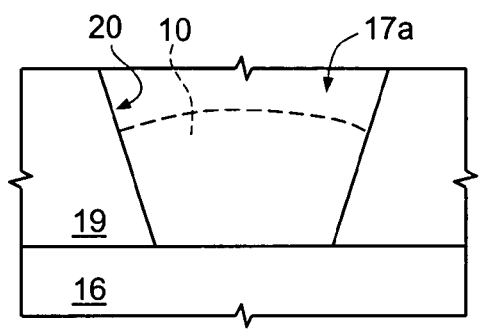
FIG. 4 is a cross-section of an enlarged detail of the device of FIG. 1 taken along the line IV-IV of FIG. 3.
Figure 5:
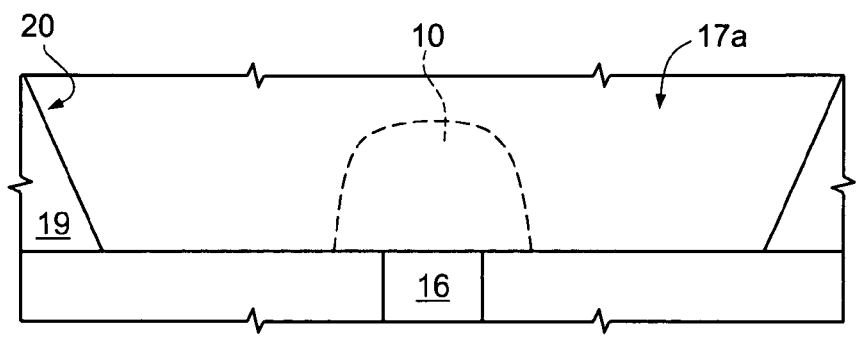
FIG. 5 is a cross-section of an enlarged detail of the device of FIG. 1 taken along the line V-V of FIG. 3.

Additionally, first and second protective layers 21, 22 may be positioned between and parallel to the strip 17 and bit lines 9. An elongated microtrench 20 (see FIG. 3) is formed through the microtrench layer 19 above and across the heating element 16 in a direction parallel to the bit lines 9. Thus, a thin portion 17a of the strip 17 fills the microtrench 20 and contacts the heating element 16, as shown in FIGS. 4 and 5. The microtrench 20 has a sublithographic width in a direction parallel to the word lines 8, so that a contact area between the thin portion 17a of the strip 17 and the heating element 16 has sublithographic extension as well.

The storage element 10 of the PCM cell 2 is formed in the thin portion 17a of the strip 17 at the contact area. On account of the sublithographic extension of the contact area, even relatively small currents flowing through the strip 17 and the heating element 16 will provide sufficient heating by Joule effect to cause phase transitions in a volume corresponding to the storage element 10. However, phase transitions are confined to a small volume within the microtrench 20 and around the contact area of the thin portion 17a and the heating element 16, while the reminder of the strip 17 does not switch from the low-resistance crystalline state. Outside the microtrench 20, in fact, current density in not high enough to heat the phase change material above the switch temperature and the crystalline state is therefore preserved.

Information stored in PCM cells 2 is associated with resistance levels (programming states) presented by the storage elements 10. In particular, the resistance level may depend on the following factors: the presence or the absence of a volume of amorphous phase change material (amorphous cap) at the interface of the heating element 16 and the thin portion 17a of the strip 17; the presence or the absence of a crystalline path through the amorphous cap; the dimension of the crystalline path.

According to one embodiment, multilevel programming of PCM cells 2 is provided and resistance levels associated at least with intermediate programming states of a PCM cell 2 are determined by controlling a length of a conductive crystalline path through an amorphous cap, so that conductive crystalline paths corresponding to different programming states have different lengths. In fact, the resistance level of an intermediate programming state is essentially determined by the resistance of the crystalline path, that is, $R=\rho L/S$ (where R is the resistance, $\rho$ is the resistivity of the phase change material, L and S are respectively the length and the average cross-section of the crystalline path).

The length of the crystalline path is essentially controlled by forming amorphous caps of appropriate volume and thickness.

The cross-section of the crystalline path may be controlled as well, by applying sequences of pulses through the amorphous cap to convert portions of amorphous phase change material into crystalline phase change material.

Figure 6:
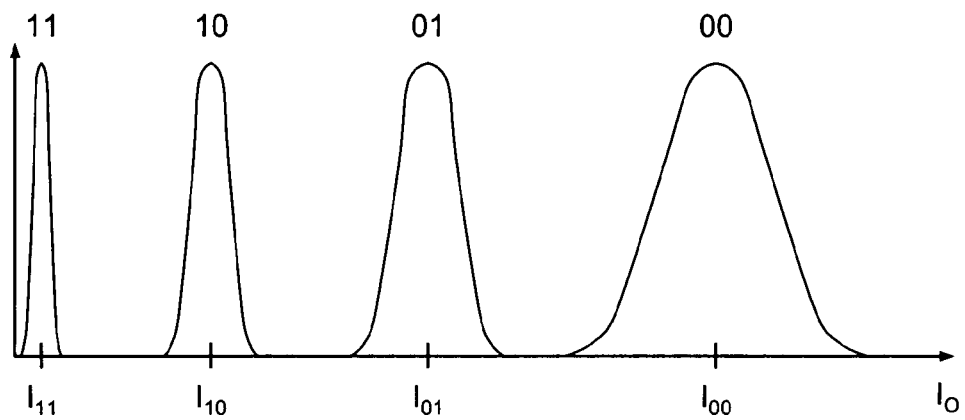
FIG. 6 is a graph showing resistance versus current for a phase change memory of FIG. 1 with four states.

In FIGS. 6-10, PCM cells 2 may be programmed at four different programming states, so that two bits may be stored in each state. It is, however, understood that a different number of programming states may be used (e.g. 8 and 16 levels for storing 3 and 4 bits, respectively). In the example of FIG. 6, bit values "00", "01", "10" and "11" are assigned to respective (decreasing) resistance levels and (increasing) output currents IO of the PCM cells.

Figure 7:
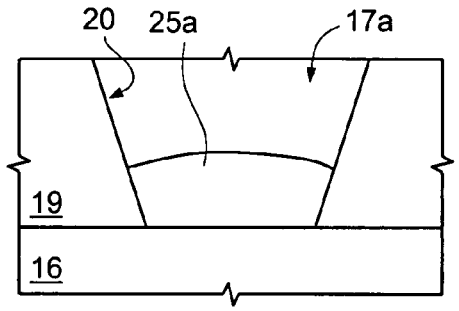
FIG. 7 shows the same view as FIG. 4, in a first programming state.

More precisely, bit value "00" is assigned to a fully reset programming state, in which the resistance level is the highest and the output current IO is correspondingly the lowest (low set current I00). As illustrated in FIG. 7, in this condition an amorphous cap 25a is formed and is not crossed by any crystalline path.

In a first intermediate programming state "01" (FIG. 8), a first conductive path 27 is formed through an amorphous cap 25b and has a first cross-section S1 and a first length L1. The conductive path 27 may be a filament formed by Joule heating, resulting from the passage of current through the amorphous cap.

Figure 9:
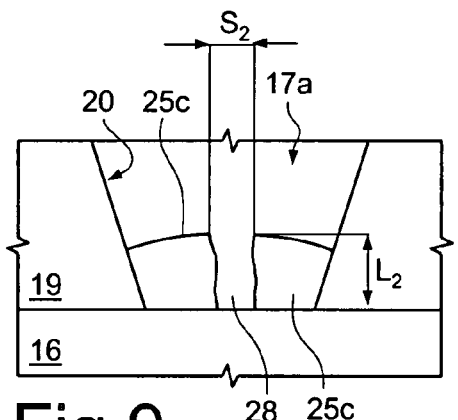
FIG. 9 shows the same view as FIG. 4, in a third programming state.

A second intermediate programming state "10" is associated with lower resistance level and higher output current IO than the first intermediate programming state "01" (FIG. 9). In the second intermediate programming state "10", an amorphous cap 25c is formed and is crossed by a second conductive path 28 having a second cross-section S2 and a second length L2. The amorphous cap 25c has a smaller volume than the amorphous cap 25b of the first intermediate state "01" and, accordingly, also the second length L2 of the second conductive path 28 is smaller than the first length L1 of the first conductive path 27. The conductive path 28 may be a filament formed by Joule heating, resulting from the passage of current through the amorphous cap.

Figure 10:
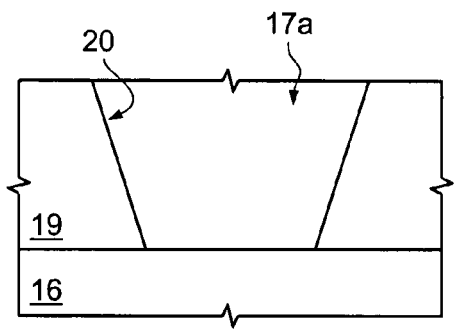
FIG. 10 shows the same view as FIG. 4, in a fourth programming state.

A fully set programming state, in which all the phase change material forming the storage element 10 is crystalline, is associated with the bit value "11" (FIG. 10). Hence, the resistance level is the lowest and the output current IO is the highest in the fully set programming state "11" (high set current I11).

Of course, in use several PCM cells 2 are in each programming state, so that some PCM cells 2 have first conductive paths 27 with the first length L1 and some PCM cells 2 have second conductive path 28 with the second length L2.

Figure 11:
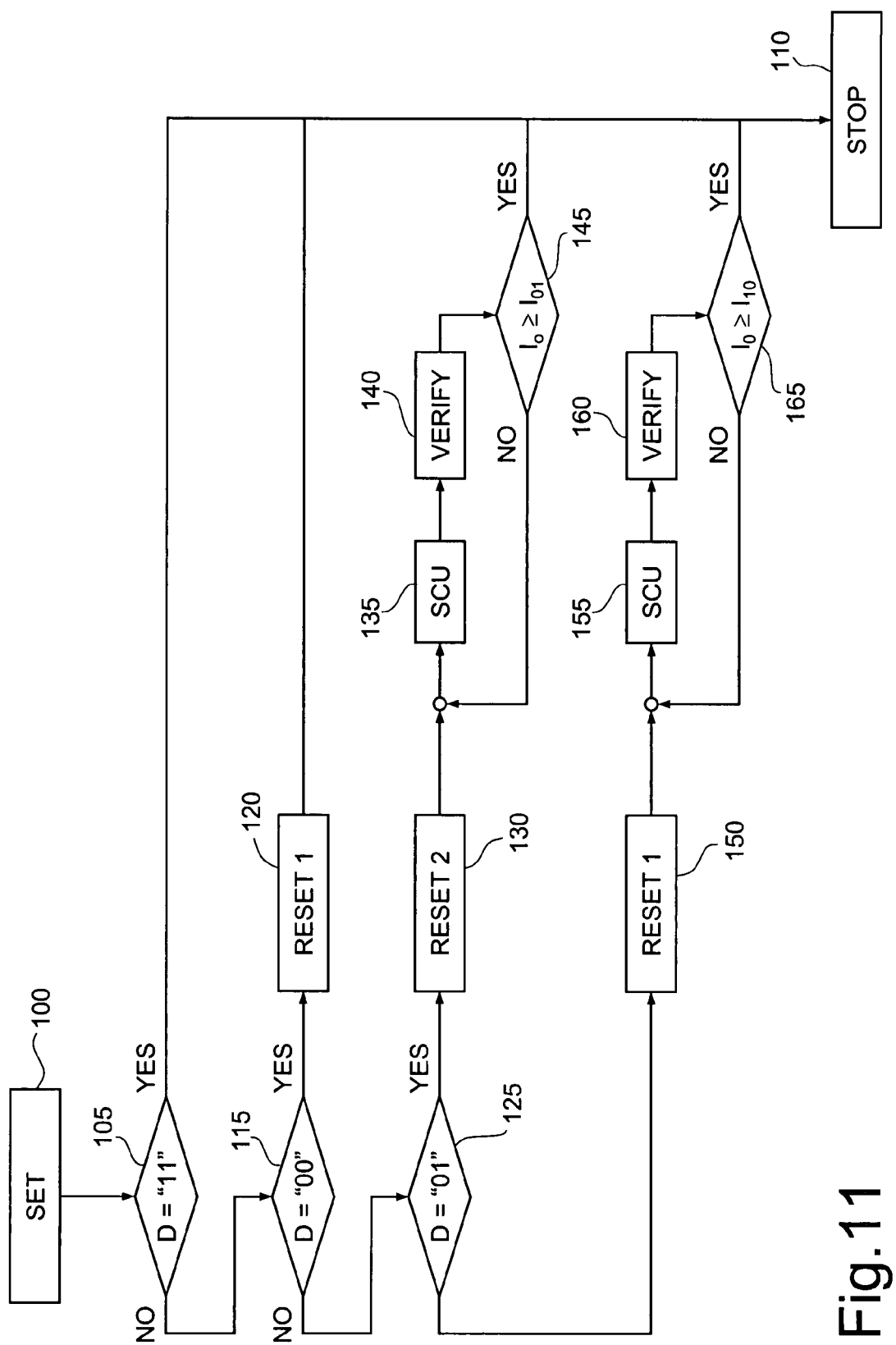
FIG. 11 is a flowchart relating to a method for programming phase change memory cells according to one embodiment of the present invention.

The control unit 6 drives the program circuit 7a and the read/verify circuit 7b to program selected PCM cells 2 as hereinafter described, with reference also to FIG. 11. FIG. 11 shows a sequence that may be implemented in hardware or software within or external to the control unit 6.

Figure 12A:
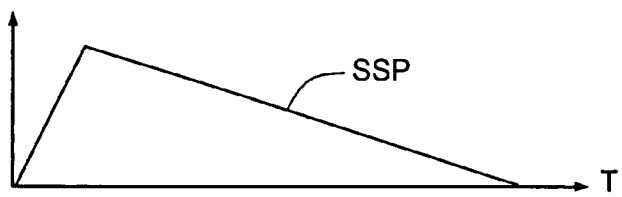
FIGS. 12a and 12b are graphs of current versus time showing signals usable in the method of FIG. 11.
Figure 12B:
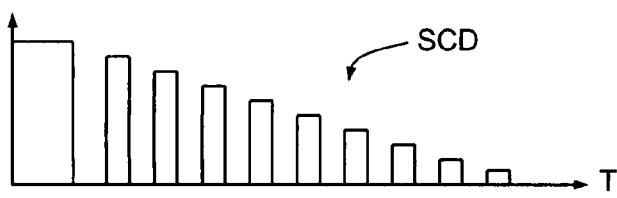

Before starting a programming cycle, in a process block 100, the storage elements 10 of a selected PCM cells 2 are cleared of possible amorphous portions by applying a full-set current pulse SET. The full-set current pulse SET is supplied by the program circuit 7a and may be e.g. in the form of so-called Set Sweep Pulse (SSP, FIG. 12a) or Staircase Down (SCD, FIG. 12b), that allow fast heating and slow cooling of the phase change material forming the storage element 10.

In decision block 105, a determination is made whether the data D to be stored in the PCM cell 2 is "11" (the fully set programming state). If so, the programming procedure is terminated (process block 110).

Otherwise a further determination is made in decision block 115, whether the data D to be stored in the PCM cell 2 is "00". If this is the case, in a process block 120 the control unit 6 drives the program circuit 7a to apply a first reset current pulse R1 to the PCM cell 2, to form the amorphous cap 25a, shown in FIG. 7. The amorphous cap 25a completely covers the interface between the heating element 16 and the thin portion 17a of the strip 17. In the embodiment herein described, the first reset current pulse R1 is configured so that the amorphous cap 25a has a controlled volume and, in particular, a thickness approximately equal to the expected second length L2. The programming procedure is then terminated (block 110). However, in other embodiments the first reset current pulse R1 may have different energy, so that the amorphous cap 25a has a greater volume.

Figure 8:
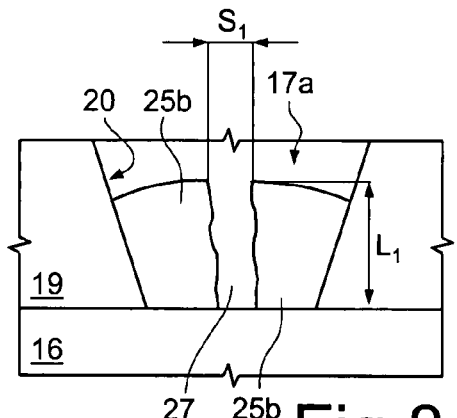
FIG. 8 shows the same view as FIG. 4, in a second programming state.

If the determination in decision block 115 is negative, a further determination is made in decision block 125, whether the data D to be stored in the selected PCM cell 2 is "01". If so, in a process block 130 the program circuit 7a is controlled to apply a second reset current pulse R2, the energy and amplitude whereof are greater than the energy and amplitude of the first reset current pulse R1. The second reset current pulse R2 forms the amorphous cap 25b as shown in FIG. 8.

The volume and thickness of the amorphous cap 25b, that covers the entire interface between the heating element 16 and the thin portion 17a, are controlled through the second reset current pulse R2 and are greater than the volume and thickness of the amorphous cap 25a.

Once the amorphous cap 25b has been created, the low-resistance first crystalline path 27 is formed therethrough. The first crystalline path 27 has the first length L1 (approximately the thickness of the amorphous cap 25b) and a controlled cross-section S1, so that the resistance level of the PCM cell 2 causes the output current IO to be nearly equal to a first intermediate set current I01, when the PCM cell 2 is read.

Figure 13:
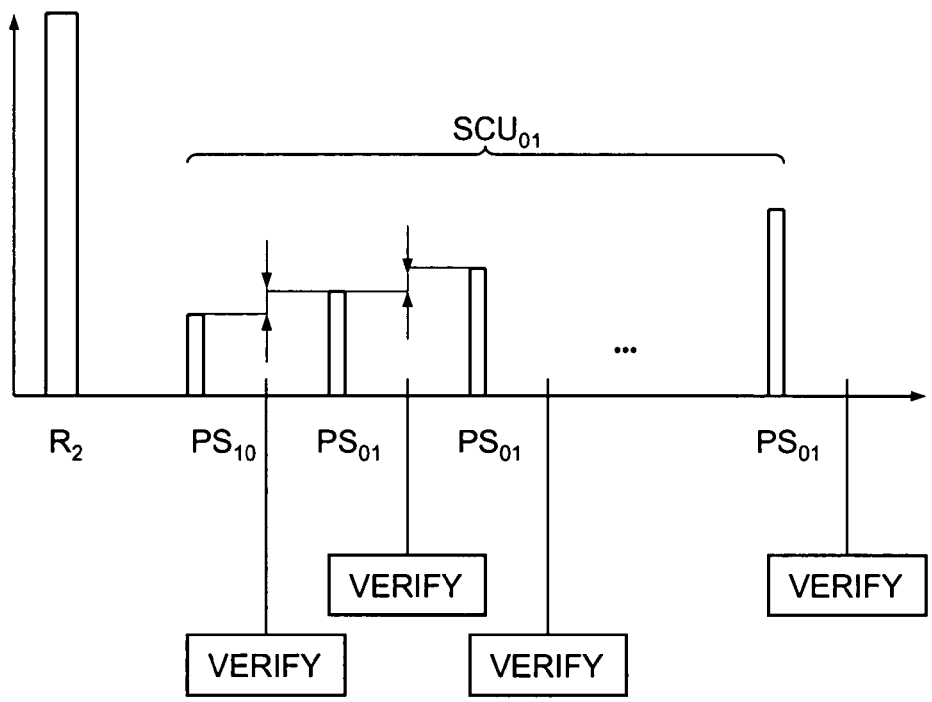
FIG. 13 is a graph of current versus time showing first programming pulses used in the method of FIG. 11.

At block 135, a first staircase up pulse sequence (SCU01) is started, by applying a first preliminary set pulse PS01 (see also FIG. 13). The amplitude of the first preliminary set pulse PS01 is determined by the control unit 6 taking into account the expected thickness of the amorphous cap 25b based on a conservative criterion, so that the reduction of the resistance level of the PCM cell 2 resulting from the creation of a crystalline path does not cause the output current IO to exceed the first intermediate set current I01, when the PCM cell 2 is read. In place of applying a single first preliminary set pulse PS01, in one embodiment, a sequence of first preliminary set pulses may be provided.

The programming state of the PCM cell 2 is then verified by the verify circuit 7b in a process block 140, (FIG. 11) wherein the PCM cell 2 is read, and in a decision block 145, wherein the output current IO is compared to the first intermediate set current I01. If the output current IO is lower, the first staircase up pulse sequence SCU01 is continued in processing block 135 by applying a new set current pulse S01K and another verify operation is carried out by the verify circuit in processing block 140 and decision block 145. The amplitude of the new set current pulse S01K is increased by a step ΔI with respect to the previous pulse (in this case, the preliminary set pulse PS01). Program/verify loops are repeated until the output current IO equals or exceeds the first intermediate set current I01. Then the programming cycle is terminated (block 110). In each program/verify loop, the amplitude of the new set pulse S01K is increased by the step ΔI with respect to the previous pulse.

If the determination in decision block 125 was negative, the data D to be stored in the selected PCM cell 2 is "10". In this case, in a process block 150 the program circuit 7a is controlled to apply the first reset current pulse R1 and create the amorphous cap 25c, as shown in FIG. 9. In the embodiment herein described, the volume of the amorphous cap 25c is the same, except for unpredictable variations, as the volume of the amorphous cap 25a of FIG. 7, that is used for the programming state "00" (hence, the volume of the amorphous cap 25c is lower than the volume of the amorphous cap 25b of FIG. 8, that is used for the programming state "01"). In particular, the thickness of the amorphous cap 25c is approximately equal to the second length L2 that is expected for the second crystalline path 28.

After creating the amorphous cap 25c, program/verify loops similar to those already described are carried out to form the second crystalline path 18 through the amorphous cap 25c. The second crystalline path 28 will have the second length L2 and a controlled cross-section S2, so that the resistance level of the PCM cell 2 causes the output current IO to be nearly equal to a second intermediate set current I10, when the PCM cell 2 is read.

Figure 14:
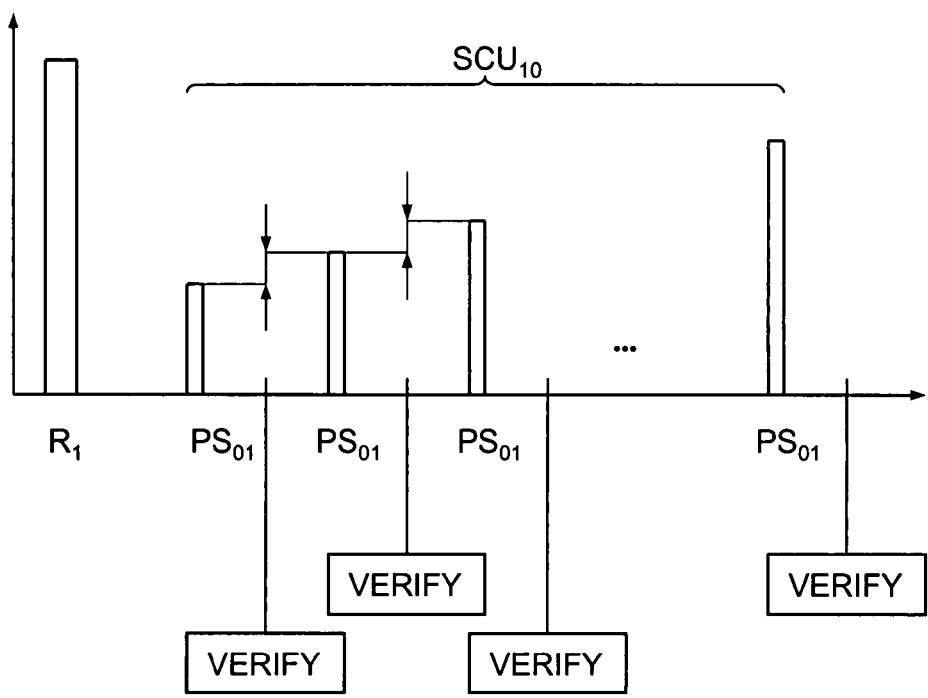
FIG. 14 is a graph showing second programming pulses used in the method of FIG. 11.

In a process step 150 a second staircase up pulse sequence SCU10 is started, by applying a second preliminary set pulse PS10 (see also FIG. 14). The amplitude of the second preliminary set pulse PS10 is determined by the control unit 6 keeping into account the expected thickness of the amorphous cap 25c and based on a conservative criterion, so that the reduction of the resistance level of the PCM cell 2 resulting from the creation of a crystalline path surely does not cause the output current IO to exceed the second intermediate set current I10, when the PCM cell 2 is read. In place of applying a single second preliminary set pulse PS01, in one embodiment a sequence of second preliminary set pulses may be provided.

The programming state of the PCM cell 2 is then verified by the verify circuit 7b in a process block 160, wherein the PCM cell 2 is read, and in a decision block 165, wherein the output current IO is compared to the second intermediate set current I10. If the output current IO is lower, the second staircase up pulse sequence SCU10 is continued in processing block 145 by applying a new set pulse S10K and another verify operation is carried out by the verify circuit in processing block 160 and decision block 165. Amplitude of the new set pulse S01K is increased by a step ΔI with respect to the previous pulse (in this case, the second preliminary set pulse PS10). Program/verify loops are repeated until the output current IO equals or exceeds the second intermediate set current I01, then the programming cycle is terminated (block 110). In each program/verify loop, the amplitude of the new set pulse S01K is increased by the step ΔI with respect to the previous pulse.

In practice, controlling the volume of the amorphous caps 25b, 25c by different first and second reset current pulses R1, R2 results in controlling the length of the crystalline paths 27, 28 and, therefore, the resistance and the programming state of the PCM cell 2. This is especially beneficial for PCM cells 2 to be programmed at intermediate programming states with lower resistance ("10" in this case). In fact, shorter crystalline paths (i.e. made through smaller amorphous caps) have a lower associated resistance and less set current pulses are required to achieve a given resistance level. In other words, the cross-section of short crystalline paths may be smaller than the cross-section of long crystalline paths, to have the same resistance level.

Reduction of the number of pulses is extremely important, in some embodiments, because the phase change material undergoes less stress and its state is therefore more stable. In particular, undesired amorphization of portions of phase change material may be avoided. Thus, data retention is favored also for most critical programming states. In addition, independent control of two parameters (length and cross-section of the crystalline paths) allows accurately setting several programming states, thereby increasing the maximum number of bits that may be stored in each PCM cell.

Figures 15, 16:
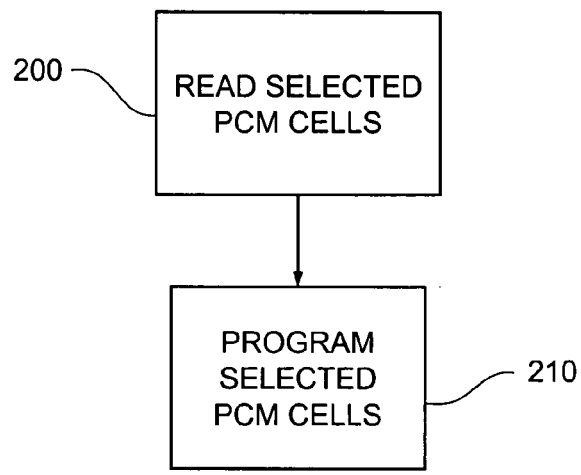
FIG. 15 is a flowchart relating to a method for programming phase change memory cells according to another embodiment of the present invention.
FIG. 16 is a table relating to the method of FIG. 15.

A second embodiment is described, with reference to FIGS. 15 and 16. In this case, the selected PCM cells 2 are preliminarily read by the read/program unit 7 in a processing block 200 of FIG. 15 and retrieved data R are used by the control unit 6 in a processing block 210 to select appropriate programming operations, according to data D to be stored. In particular, operations may be selected based on the table shown in FIG. 16.

No actions are taken if retrieved data R and data D to be stored are the same (boxes with R=D, along the left to right diagonal in FIG. 16, as indicated by STOP). If data D to be stored is "11", a full-set current pulse SET is applied, irrespective of the previous content of the PCM cell 2 (D="11", any value of R, except "11" in FIG. 16).

If data D to be stored is "00", the first reset current pulse R1 is applied, whatever the retrieved data R is (D="00", any value of R, except "00" in FIG. 16). Possibly, in order to have always the same volume for the amorphous cap 25a in the programming state "00", the first reset current pulse R1 may be preceded by a full-set current pulse SET, if the previous data was "01" (D="00", R="01" in FIG. 16). However, also a greater amorphous volume would be acceptable, because the programming state "00" is associated with the highest resistance level.

If data D to be stored is "01", the program circuit 7a is in any case controlled to apply the second reset current pulse R2 and then the first staircase up pulse sequence SCU01 as already explained, until output current IO of the PCM cell 2 reaches the first intermediate set current I01 (D="01", any value of R, except "01" in FIG. 16).

If data D to be stored is "10" and the retrieved data R is "11" the first reset current pulse R1 is applied and is followed by the second staircase up pulse sequence SCU10 as already explained, until output current IO of the PCM cell 2 reaches the second intermediate set current I10 (D="10", R="11" in FIG. 16). If, instead, the retrieved data is "00" or "01" (D="10", R="00" and R="01" in FIG. 16), the first reset current pulse R1 and the second staircase up pulse sequence SCU10 are preceded by a full-set current pulse SET, to clear the storage element 10 and avoid amorphizing a volume in excess of the expected volume of the amorphous cap 25c.

In this manner, unnecessary set and reset operations may be avoided, thereby saving programming time and reducing stress on the phase change material in some embodiments.

Figure 17:
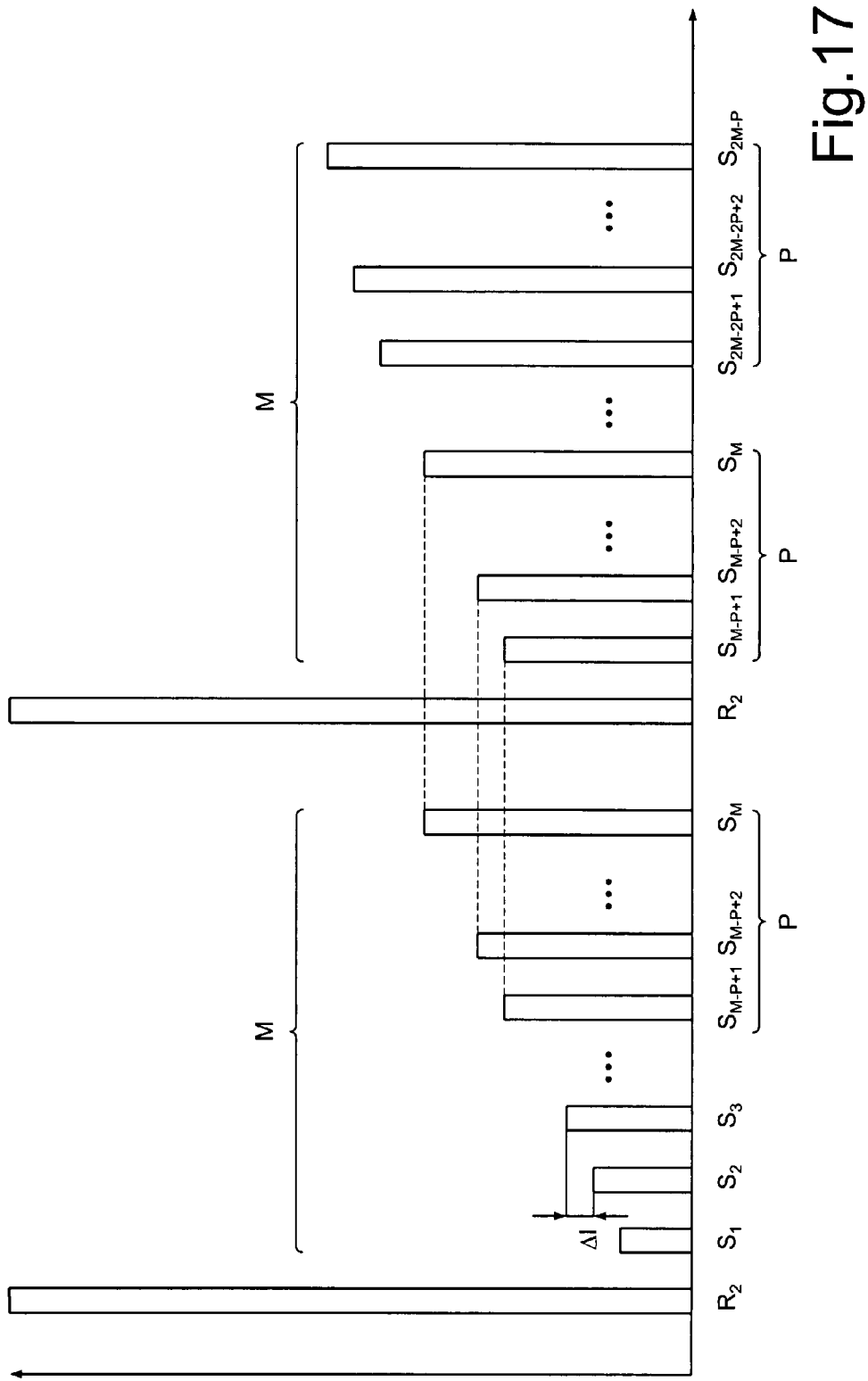
FIGS. 17-23 are graphs showing programming pulses used in respective embodiments of the method according to the present invention.

According to another embodiment, a plurality of staircase pulse sequences are delivered as illustrated in FIG. 17 (where a first and a second staircase pulse sequences are shown). In particular, FIG. 17 and the relevant description specifically refer to the first staircase up pulse sequence SCU01, but it is understood that the same apply to the second staircase up pulse sequence SCU10 as well.

After the second reset current pulse R2 has been provided, a first partial sequence of at most M set current pulses S1, S2, . . . , SM is applied (M being an integer number). The amplitude of the set current pulses S1, S2, . . . , SM is increased by steps of ΔI starting from the lowest set current pulse S1. A verify step is carried out after each pulse.

If the desired programming state has not been reached after the M-th set current pulses S1, S2, . . . , SM, a new second reset current pulse R2 is applied, so that the amorphous cap 25b is fully restored. Then, a second partial sequence of at most M set current pulses SM-P+1, SM-P+2, S2M-P. In practice, the first (initial) P set current pulses of the second partial sequence have the same amplitude as the last (terminal) P set current pulses of the first partial sequence. In practice, a plurality of partial sequences of at most M pulses are provided, until the desired programming state has been reached. Then programming process is interrupted. Two adjacent partial sequences are separated by a reset pulse (a second reset pulse R2, in this case). In each partial sequence, the amplitudes of the set current pulses are progressive increased by steps ΔI form the first to the M-th pulse. Moreover, the first P set current pulses have the same amplitudes of the last P set current pulses of the previous partial sequence. The maximum number M of set current pulses in each sequence is determined so that stability of the amorphous material is not affected. Advantageously, overlapping in pulse amplitudes of adjacent sequence prevents programming errors due to possible fluctuations in the amount of amorphized phase change material when equal reset pulses are applied.

According to further embodiments, in whatever sequence, set current pulses may have other form, instead of being rectangular. In particular, set current pulses may have sloping edges instead of vertical edges to control heating and cooling of the phase change material.

Figure 18:
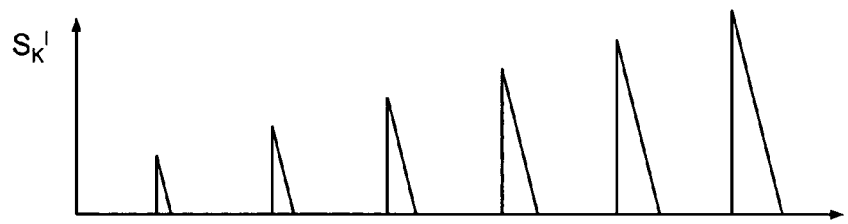

In one embodiment (FIG. 18), set current pulses SKI provided by the program circuit 7a are triangular, with vertical leading edges and constantly sloping trailing edges (slope is the same for all pulses).

Figure 19:
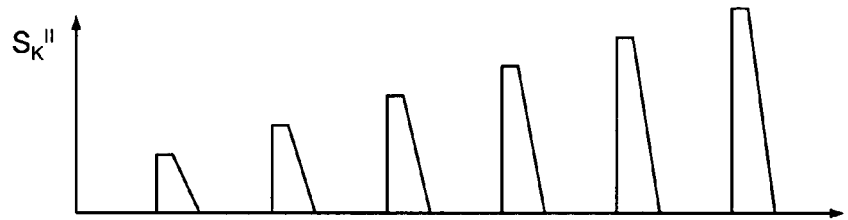

In another embodiment (FIG. 19), set current pulses SKII are trapezoidal, with vertical leading edges and constantly sloping trailing edges.

Figure 20:
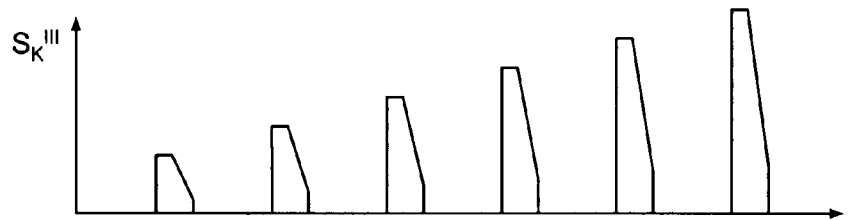

In the embodiment of FIG. 20, trailing edges of set current pulses SKIII initially have constant slope and are interrupted when the current level can no longer cause sufficient heating to amorphize the phase change material.

Figure 21:
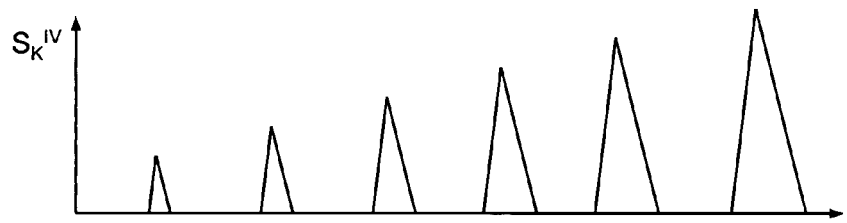

In another embodiment (FIG. 21), triangular set current pulses SKIV have constantly sloping leading and trailing edges (the slopes of the leading edges and of the trailing edges are not necessarily equal, however; leading edges are normally steeper).

Figure 22:
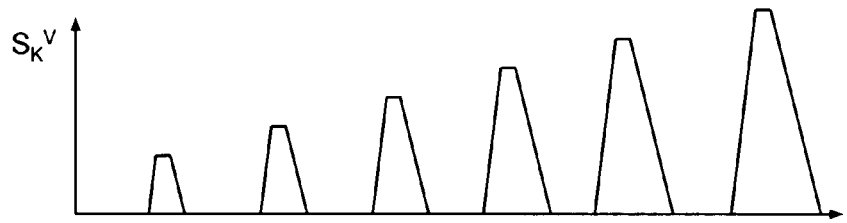

In the embodiment of FIG. 22, all leading and trailing edges of set current pulses SKV are constantly sloping. Moreover, a constant section is interposed between leading and trailing edges of each set current pulse SKV.

Figure 23:
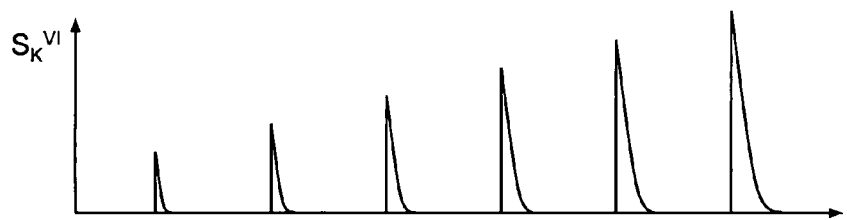

In the embodiment of FIG. 23, trailing edges of set current pulses SKVI are smoothed, in this case exponentially.

Edge control provides further advantages. For example, slow cooling prevents the formation of undesired amorphous pockets in crystalline paths. Furthermore, in both heating and cooling, the current density in the crystalline paths may be kept constant, to maintain stable and controlled temperature conditions in the phase change material, in an optimal temperature range for the formation of crystals. Greater precision and lower programming time may be thus achieved.

Figure 24:
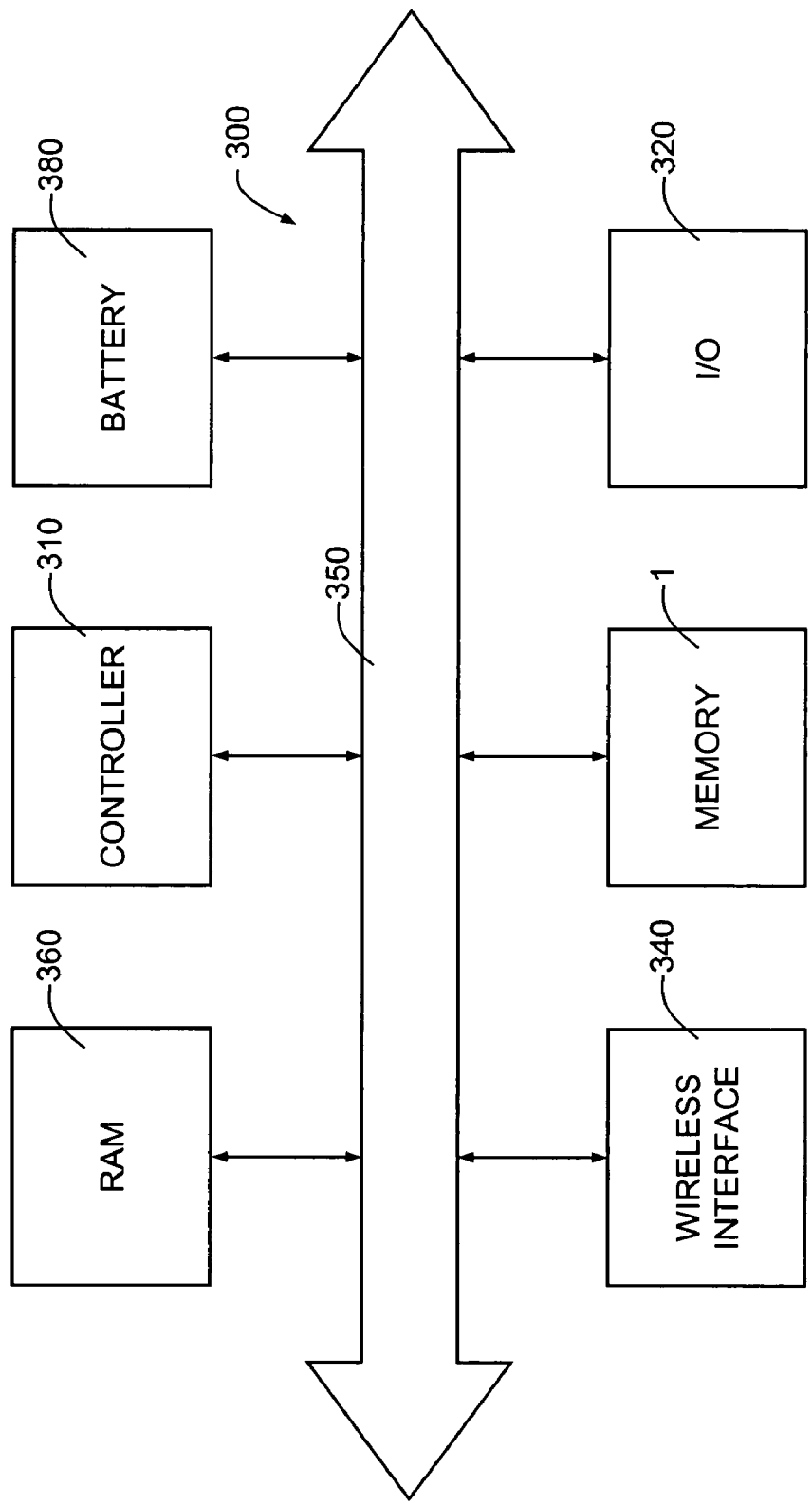
FIG. 24 is system depiction of one embodiment of the present invention.

In FIG. 24, a portion of a system 300 in accordance with an embodiment of the present invention is illustrated. System 300 may be used in devices such as, for example, a personal digital assistant (PDA), a laptop or portable computer, possibly with wireless capability, a cell phone, a messaging device, a digital music player, a digital camera, or other devices that may be adapted to process, store, transmit or receive information and require permanent storage capability.

System 300 may include a controller 310, an input/output (I/O) device 320 (e.g. a keyboard, display), the phase-change memory device 1, a wireless interface 340, and a RAM memory 360, coupled to each other via a bus 350. A battery 380 may be used to supply power to the system 300 in one embodiment. It should be noted that the scope of the present invention is not limited to embodiments having necessarily any or all of above listed components.

Controller 310 may comprise, for example, one or more microprocessors, digital signal processors, micro-controllers, or the like.

The I/O device 320 may be used to generate a message. The system 300 may use the wireless interface 340 to transmit and receive messages to and from a wireless communication network with a radio frequency (RF) signal. Examples of the wireless interface 340 may include an antenna, or a wireless transceiver, such as a dipole antenna, although the scope of the present invention is not limited in this respect. Also, the I/O device 320 may deliver a voltage reflecting what is stored as either a digital output (if digital information was stored), or as analog information (if analog information was stored).

Finally, it is clear that numerous modifications and variations may be made to the method and the device described and illustrated herein, all falling within the scope of the invention, as defined in the attached claims.

In particular, more than two bits might be stored in each PCM cell (e.g. three or four, corresponding to 8 and 16 programming states, respectively). In this case, control of length of crystalline paths may be accomplished by providing more than two different reset pulses, to form amorphous caps having respective different volumes. Further programming states may then be obtained by controlling the cross-section of crystalline paths having the same length, using appropriate sequences of set pulses.

In the foregoing description, reference has been made to a memory device and PCM cells exploiting current pulses for programming. It is understood that memory devices and PCM cells readable and/or programmable by voltage pulses may be used.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
    forming crystalline paths of at least two different lengths through phase change cells of a phase change memory to indicate two different programmed states;
    providing at least two different volumes of the amorphous phase change material in two cells of said phase change memory;
    applying a first reset pulse to form a first amorphous volume for a first programming state and a second reset pulse to form a second amorphous volume for the second programming state.

2. The method of claim 1 including forming said amorphous volumes from less than all of a volume of phase change material in a cell.

3. The method of claim 1 including applying a first reset pulse having a greater amplitude than the second reset pulse.

4. The method of claim 3 further including applying sequences of set pulses to convert portions of said amorphous volumes into crystalline phase change material.

5. The method of claim 4 including applying sequences of set pulses with sloping edges.

6. The method of claim 4 wherein applying sequences of set pulses comprises:
    applying one reset pulse;
    applying at least a first partial sequence of set pulses;
    applying at least one further reset pulse, if a desired programming state has not been reached after applying the first partial sequence of set pulses; and
    applying at least a second partial sequence of set pulses.

7. The method of claim 6 including applying the set pulses of the first partial sequence of set pulses and the set pulses of the second partial sequence of set pulses having increasing amplitude and wherein a plurality of initial set pulses of the second partial sequence of set pulses have the same amplitude as corresponding terminal set pulses of the first partial sequence of set pulses.

8. The method of claim 6 wherein forming crystalline paths includes verifying a resistance level of a programmed cell after each set pulse of the sequences of set pulses.

9. A phase change memory comprising:
    a plurality of cells; and
    a program unit to program the cells to form crystalline paths of different lengths in two different cells to indicate two different states;
    wherein at least two of said cells have amorphous regions of different size; and wherein the vertical height of said cells is different.

10. The memory of claim 9 wherein said memory is a multilevel memory.

11. The memory of claim 9 wherein said memory includes cells with at least four different states, at least two of said states being differentiated by the length of a crystalline path through an amorphous region.

12. The memory of claim 11 wherein said crystalline path is a filament.

13. The memory of claim 9, said program unit to apply a first reset pulse having a greater amplitude than a second reset pulse, said first reset pulse to form one amorphous region and said second reset pulse to form a second amorphous region.

14. The memory of claim 13, said program unit to apply a sequence of set pulses to convert portions of said amorphous regions into crystalline phase change material.

15. The memory of claim 14, said program unit to apply pulses having sloping edges.

16. The memory of claim 15, said program unit to apply sequences of set pulses to determine if a desired programming state has been reached and, if not, apply a reset pulse and to apply a second sequence of set pulses.

17. The memory of claim 9 wherein at least a first cell has the first crystalline path with the first length and a second cell has the second crystalline path with the second length different than the first length.

18. A system comprising:
    a processing unit;
    a wireless interface coupled to said processing unit; and
    a phase-change memory device coupled to said processing unit, said phase change memory device including a plurality of cells and a program unit to form crystalline paths of different lengths in two different cells to indicate two different states;
    wherein at least two of said cells have amorphous regions of different size; and wherein the vertical height of said cells is different.

19. The system of claim 18 wherein said memory is a multilevel memory.

* * * * *